(12) United States Patent
Dutartre et al.

(10) Patent No.: US 7,622,368 B2
(45) Date of Patent: Nov. 24, 2009

(54) FORMING OF A SINGLE-CRYSTAL SEMICONDUCTOR LAYER PORTION SEPARATED FROM A SUBSTRATE

(75) Inventors: Didier Dutartre, Meylan (FR); Nicolas Loubet, Grenoble (FR); Alexandre Talbot, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 273 days.

(21) Appl. No.: 11/704,638

(22) Filed: Feb. 9, 2007

(65) Prior Publication Data

US 2007/0190754 A1 Aug. 16, 2007

(30) Foreign Application Priority Data

Feb. 10, 2006 (FR) .................................. 06 50474

(51) Int. Cl.
*H01L 21/20* (2006.01)
*H01L 21/36* (2006.01)

(52) U.S. Cl. .................... 438/478; 438/421; 438/149

(58) Field of Classification Search ............. 257/151, 257/191, 200, 211, 296, 315, 347, 350, 411, 257/622; 438/149, 285, 300, 421, 424, 492, 438/763, 478
See application file for complete search history.

(56) References Cited

U.S. PATENT DOCUMENTS

| 6,713,356 | B1 | 3/2004 | Skotnicki et al. | |
|---|---|---|---|---|
| 7,091,540 | B2 * | 8/2006 | Kim et al. | 257/296 |
| 7,256,077 | B2 * | 8/2007 | Orlowski | 438/151 |
| 2001/0045604 | A1 | 11/2001 | Oda et al. | |
| 2004/0108559 | A1 | 6/2004 | Sugii et al. | |
| 2005/0054169 | A1 * | 3/2005 | Wagner et al. | 438/311 |
| 2005/0118783 | A1 * | 6/2005 | Oh et al. | 438/421 |
| 2005/0212018 | A1 * | 9/2005 | Schoellkopf et al. | 257/288 |
| 2006/0035417 | A1 * | 2/2006 | Lee | 438/149 |

FOREIGN PATENT DOCUMENTS

FR 2 856 521 A1 12/2004

OTHER PUBLICATIONS

French Search Report from corresponding French Application No. 06/50474, filed Feb. 10, 2006.

* cited by examiner

*Primary Examiner*—Bradley K Smith
*Assistant Examiner*—Errol Fernandes
(74) *Attorney, Agent, or Firm*—Lisa K. Jorgenson; James H. Morris; Wolf, Greenfield & Sacks, P.C.

(57) ABSTRACT

A method for forming a single-crystal semiconductor layer portion above a hollowed area, including growing by selective epitaxy on an active single-crystal semiconductor region a sacrificial single-crystal semiconductor layer and a single-crystal semiconductor layer, and removing the sacrificial layer. The epitaxial growth is performed while the active region is surrounded with a raised insulating layer and the removal of the sacrificial single-crystal semiconductor layer is performed through an access resulting from an at least partial removal of the raised insulating layer.

14 Claims, 3 Drawing Sheets

FORMING OF A SINGLE-CRYSTAL SEMICONDUCTOR LAYER PORTION SEPARATED FROM A SUBSTRATE

BACKGROUND OF THE INVENTION

1. Field of the Invention

The present invention relates to the forming of a thin single-crystal semiconductor layer portion separated from a single-crystal semiconductor substrate by a vacuum or by one or several non single-crystal layers.

2. Discussion of the Related Art

In many semiconductor devices, it is desirable to have at least one thin single-crystal semiconductor layer separated from a single-crystal semiconductor substrate by a vacuum or one or several layers of different natures and especially insulating and/or conductive layers.

For this purpose, a known method comprises the growth of a first sacrificial single-crystal layer on a single-crystal substrate and of a second single-crystal layer on the first one. After this, the sacrificial layer is removed and the volume that it took up may be filled back, partially or totally, with one or several materials.

FIGS. 1A to 1E are cross-section views illustrating different steps of a known method for manufacturing a MOS transistor on/in a very thin single-crystal silicon layer insulated from an underlying semiconductor layer.

FIG. 1A shows a semiconductor single-crystal silicon wafer 1 in which active regions 3 are defined by insulation areas 5. Areas 5 generally are trenches dug into wafer 1, then filled with an insulating material.

After this, a sacrificial single-crystal semiconductor layer 7 is grown. Layer 7 for example is a silicon-germanium layer (SiGe) containing from 20 to 40% of germanium. Close to the insulating periphery formed by insulation areas 5, the silicon-germanium grows with an angle which tends to draw it away from periphery 5. This results in a faceting 9 of the periphery. At the level of faceting 9, sacrificial layer 7 exhibits an irregular thickness. Only the central horizontal portion 11 of sacrificial layer 7 is homogeneous in terms of thickness.

Then, as illustrated in FIG. 1B, a semiconductor single-crystal silicon layer 13 is formed on sacrificial layer 7. Layer 13 generally exhibits a double faceting. FIG. 1B and the following ones illustrate such a double faceting, it being understood that silicon layer 13 may exhibit a single faceting or a more complex faceting. A faceting 15 is linked to the growth of layer 13 close to insulating periphery 5 and to the presence of underlying faceting 9. Another faceting 17 is present at the periphery of a central platform 19 of layer 13 which grows on central portion 11 of layer 7.

Then, as illustrated in FIG. 1C, gate 21 of a transistor is formed on layer 13. Gate 21 is insulated from underlying layer 13 by a thin insulator 22 and is surrounded with an insulating peripheral lateral spacer 23. Source/drain implantations are performed.

FIG. 2 is a top view corresponding to FIG. 1C. It shows facetted regions 15 and 17 around central portion 19 of layer 13 and insulated gate 21 which crosses active region 3 and bears on insulation areas 5. It should be noted that FIGS. 1A to 1E are cross-section views along axis I-I' perpendicular to the extension axis of gate 21. As illustrated in FIG. 2, gate 21 passes twice on facetings 15 and 17 shown in dotted lines.

At this stage of the method, it is desired to remove sacrificial silicon-germanium layer 7. However, as illustrated in the cross-section view of FIG. 1C, SiGe layer 7 is still coated with Si layer 13. To be able to access to SiGe layer 7, Si layer 13 must thus be locally removed.

For this purpose, as illustrated in FIG. 1D, a specific mask M exhibiting a dimension greater than that of gate 21 but lower than that of layer 13 must be formed. Mask M is generally designed to only partially cover central portion 19 of layer 13 on either side of gate 21. The peripheral portion, illustrated in dotted lines, of silicon layer 13 is removed so that underlying sacrificial layer 7 is partially exposed.

Then, before or after removal of mask M, an etching capable of selectively eliminating silicon-germanium layer 7 is performed. After removal of layer 7, layer 13 is maintained in place by upper gate 21 which bears on insulation areas 5. The empty interval created by the removal of layer 7 is then kept to obtain a silicon substrate on nothing or filled with any appropriate element.

For example, as illustrated in FIG. 1E, an insulating material 25 which fills the interval between Si layer 13 and Si substrate 3 is deposited.

A MOS transistor comprising an insulated gate 21 and having a channel region 13 of low thickness, generally ranging between 5 and 20 nm, preferably lower than 10 nm, and typically on the order of 6 to 7 nm, is then obtained on a local insulator 25 of low thickness ranging between 10 and 30 nm, preferably approximately 10 nm.

Such a method exhibits various disadvantages which will be detailed in relation with FIG. 3, which illustrates the structure of FIG. 1E in cross-section view along plane III-III' of FIG. 2 parallel to the extension axis of gate 21, perpendicular to cross-section axis I-I' of FIGS. 1A to 1E. Thus, the portion of silicon layer 13 illustrated in FIG. 3 corresponds to a cross-section of the channel region under gate 21.

It can be seen in FIG. 3 that the channel of the MOS transistor formed by layer 13 exhibits significant thinnings on either side of its central portion 19 due to the existence of the above-mentioned facetings 9, 15, and 17. Further, such thinnings occur at a location where insulator 25 separating channel 13 from underlying active region 3 also exhibits a thinning. Such thinnings of channel 13 and of insulator 25 especially cause two types of malfunctions.

On the one hand, to the thinned channel areas corresponds a parasitic. MOS transistor having a threshold voltage much lower than that of the main central transistor formed at the level of horizontal portion 19 of layer 13. The unwanted premature turning-on of the peripheral parasitic transistor with respect to the central transistor is particularly disadvantageous.

On the other hand, the thinning of insulator 25 causes, close to periphery 5, that is, at the location where the structure is most fragile, a significant collapse of the equipotential lines in insulator 25. Insulator 25 is likely to breakdown and to short-circuit channel 13 and underlying active region 3.

Another disadvantage of the forming of the facetings lies in the pyramidal decrease in the horizontal central surface area of the upper layer. Thus, there appears from FIGS. 1A to 1E and 3 that central horizontal portion 11 of layer 7 is decreased with respect to the surface area of active region 3. Similarly, as illustrated in FIGS. 1B to 1E, 2 and 3, central portion 19 of layer 13 is smaller still. In cross-section view, with respect to active region 3; central portion 19 looses on each side from two to three times the sum of the thicknesses of layers 7 and 13. Thus, if the stacking of layers 7 and 13 exhibits a total thickness on the order of 30 nanometers, from 60 to 90 nm are lost on each side, that is, a total thickness from 120 to 180 nm. On design of the circuits, account needs to be taken of this decrease in the useful surface area with respect to the surface area of active region 3. This is an obstacle to the decrease in the device dimensions.

Further, the lost surface area increases along with the increase in the number of superposed layers. This is particularly disturbing on forming of multiple-layer structures such as, for example, multiple-gate transistors. This lost surface area also increases due to the fact that a non-self-aligned masking step needs to be provided.

The same problems as those described previously on forming of transistors exhibiting a gate of all-around type, in which the gate is formed all around a channel area, are encountered. In this case, the empty interval resulting from the removal of layer 7 is filled with an insulator and a gate conductor which surround channel 13.

SUMMARY OF THE INVENTION

The present invention accordingly aims at providing a structure of superposed thin single-crystal layers among which a sacrificial layer is desired to be eliminated, which overcomes at least some of the disadvantages of known structures.

The present invention also aims at providing a method for manufacturing MOS transistors where the channel region exhibits a homogeneous thickness and is separated from a semiconductor underlying wafer by at least one non single-crystal layer of homogeneous thickness.

To achieve these and other objects, the present invention provides a method for forming a single-crystal semiconductor layer portion above a hollowed area, comprising the steps of growing, by selective epitaxy, on an active single-crystal semiconductor region, a sacrificial single-crystal semiconductor layer and a single-crystal semiconductor layer, and removing the sacrificial single-crystal semiconductor layer. The epitaxial growth is performed while the active region is surrounded with a raised insulating layer and the removal of the sacrificial single-crystal semiconductor layer is performed through an access resulting from an at least partial removal of the raised insulating layer.

According to an embodiment of the present invention, the active single-crystal semiconductor region and the single-crystal semiconductor layer are made of silicon, and the sacrificial layer is made of silicon-germanium.

According to an embodiment of the present invention, the active region is initially delimited by an insulation area at the same level as its upper surface, and the method comprises, before epitaxy of said layers, the step of lowering the upper surface of the active region by a height lower than the depth of said insulation areas.

According to an embodiment of the present invention, the lowering height of the upper surface of the active region is substantially equal to the sum of the thicknesses of the epitaxial layers.

According to an embodiment of the present invention, the active region is initially delimited by an insulation area formed above a semiconductor layer or substrate.

According to an embodiment of the present invention, the empty interval left by the removal of the sacrificial layer is filled with an insulator.

According to an embodiment of the present invention, the empty interval left by the removal of the sacrificial layer is filled with an electrically or thermally conductive material such as a metal.

The present invention applies to the forming of a MOS transistor with one or several gates.

According to an embodiment of the present invention, the removal of the sacrificial layer is performed after forming of an insulated gate on said single-crystal semiconductor layer.

According to an embodiment of the present invention, the forming of the gate is followed by a step of epitaxial growth of a single-crystal semiconductor material of same nature as that of the channel, intended to form raised source/drain areas.

The foregoing and other objects, features, and advantages of the present invention will be discussed in detail in the following non-limiting description of specific embodiments in connection with the accompanying drawings.

DETAILED DESCRIPTION

As usual in the representation of semiconductor components, the various drawings are not to scale. Further, it should be noted that the insulating materials have been shown with hatchings in the different drawings.

An application to the forming of a single-gate MOS transistor of a method according to an embodiment of the present invention is described hereafter in relation with the cross-section views of FIGS. 4A to 4F and 5.

Figure 4A:
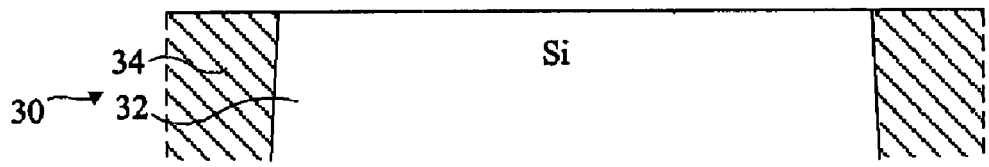
FIGS. 4A to 4F are cross-section views of different steps of the forming of a MOS transistor according to an embodiment of the present invention.

FIG. 4A is a cross-section view of a single-crystal semiconductor wafer 30 comprising an active region 32 delimited by insulation areas 34. Wafer 30 is, for example, made of single-crystal silicon. Areas 34 are formed of shallow trenches filled with an insulator (STI).

Figure 4B:
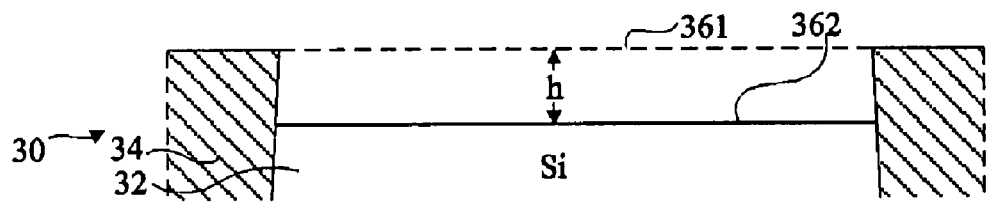

As illustrated in FIG. 4B, active region 32 is selectively etched with respect to peripheral insulation areas 34. This etching is performed by any silicon etch method, for example, an isotropic or anisotropic plasma dry etch method, or a wet chemical etch method, or else a method for etching in gaseous phase in the presence of gaseous hydrochloric acid implementable in the epitaxy reactor. The upper surface of region 32 is lowered by a height h, from level 361 to level 362. Height h is especially selected to be lower than the depth of insulation areas 34.

Figure 4C:
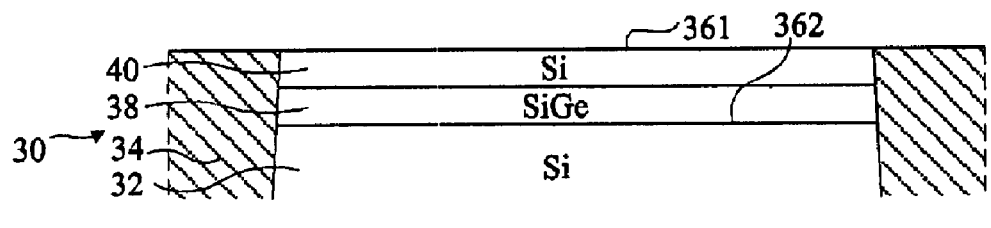

Then, as illustrated in FIG. 4C, a sacrificial silicon-germanium layer 38, followed by a silicon layer 40, are grown by selective epitaxy only on surface 362 of single-crystal region 32. Height h of lowering of the surface of region 32 has been selected according to the thicknesses of layers 38 and 40 so that the upper surface of Si layer 40 substantially reaches initial level 361.

On growth of SiGe and Si layers 38 and 40, the substantially vertical walls of peripheral insulation areas 34 prevent the previously-described forming of facets.

Figure 4D:
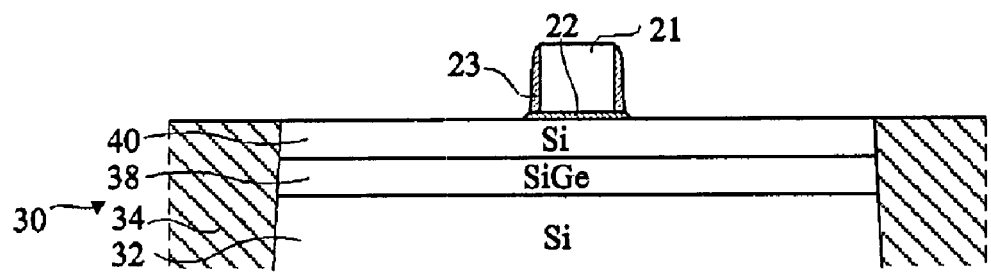

The method carries on, as illustrated in FIG. 4D, with the forming on Si layer 40 of insulated gate 21 of a transistor.

Figure 4E:
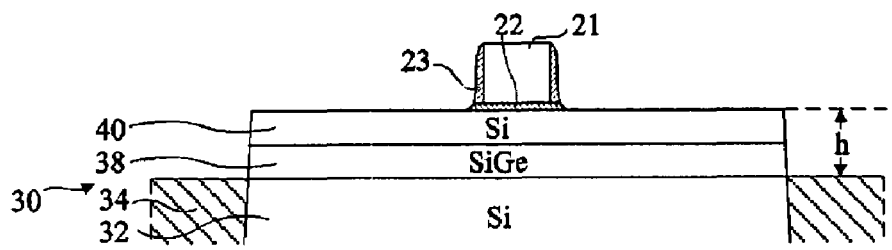

Then, as illustrated in FIG. 4E, a selective etching of insulation areas 34 is performed. The upper surface of insulation areas 34 is lowered down to a level lower than the limit between layers 38 and 40. Preferably, the etching of insulation areas 34 is performed from initial recess height h of region 32 (FIG. 4B).

It should be noted that the etching of the upper surface of insulation areas 34 does not require a masking step and that after this etching, the edges of sacrificial layer 38 are apparent. This layer can thus be directly eliminated.

Figure 4F:
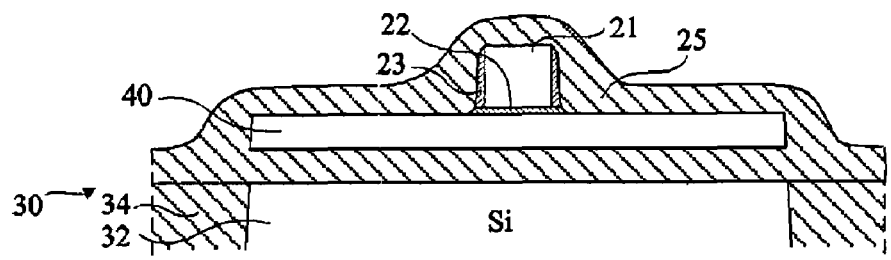

At the next steps illustrated in FIG. 4F, silicon-germanium layer 38 is selectively removed and replaced with any appropriate element, for example, an insulator 25.

A MOS transistor having its channel region 40 exhibiting a thin thickness ranging between 5 and 20 nm, preferably lower than 10 nm, for example, from 6 to 7 nm, and separated from a local insulator 25 from underlying substrate 32 is thus formed.

Figure 1A:
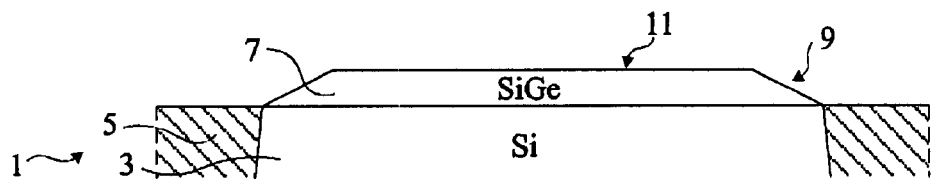
FIGS. 1A to 1E, previously described, illustrate in cross-section view different steps of the forming of a MOS transistor according to a known method.
Figure 1B:
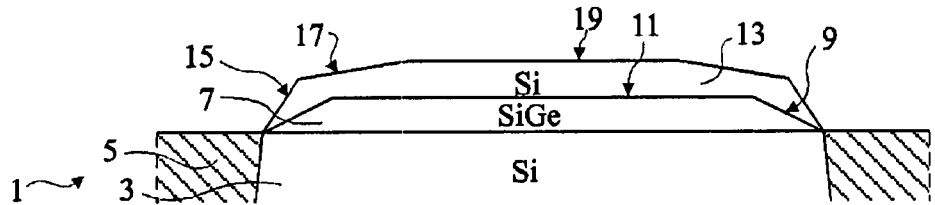
Figure 1C:
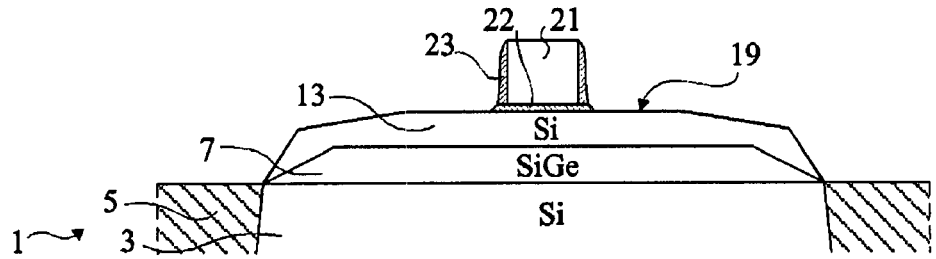
Figure 1D:
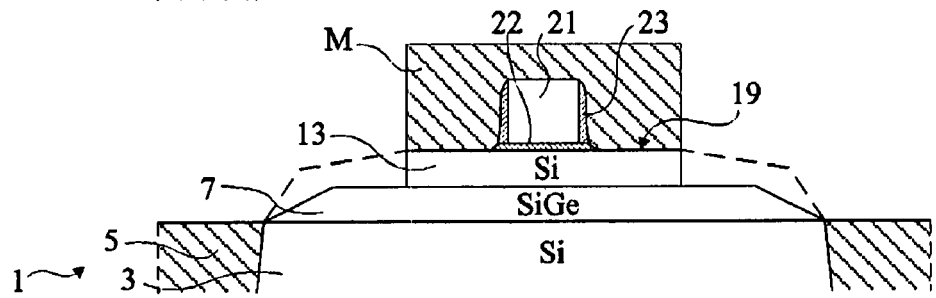
Figure 1E:
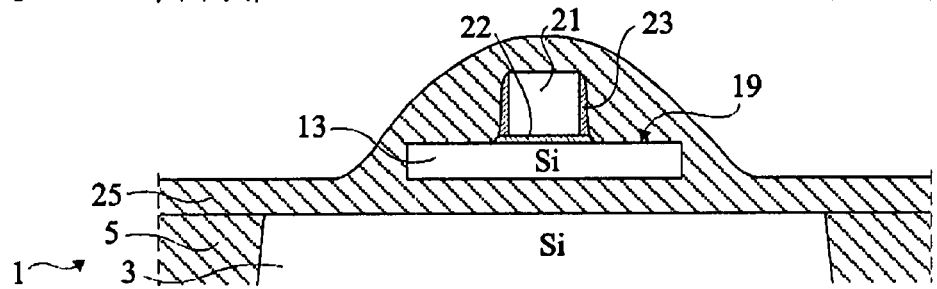
Figure 2:
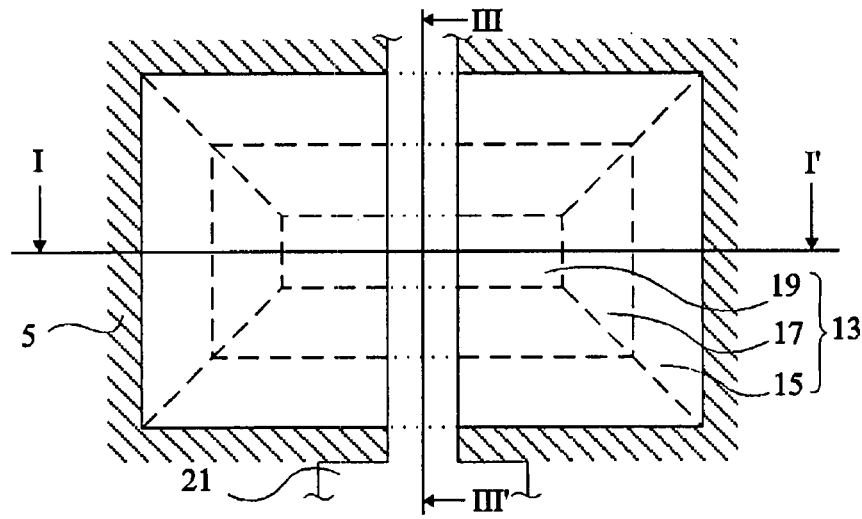
FIG. 2, previously described, is a top view of FIG. 1C.
Figure 3:
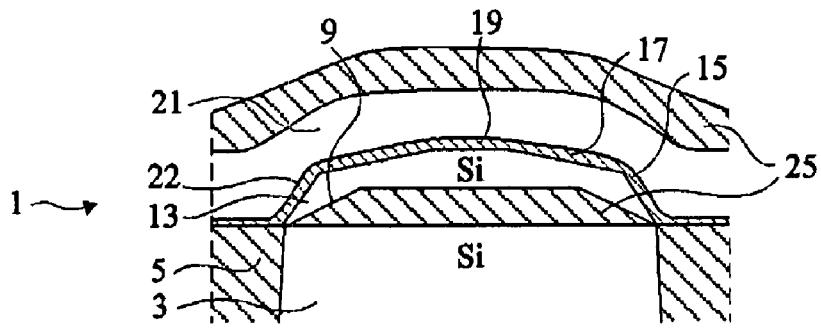
FIG. 3, previously described, is a cross-section view of the structure of FIG. 1E along plane III-III' of FIG. 2.
Figure 5:
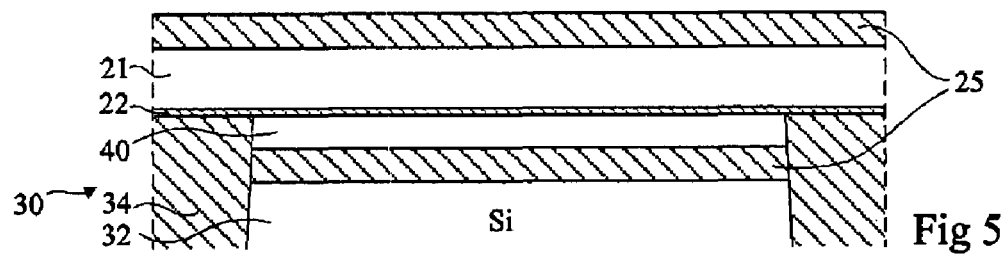
FIG. 5 is a cross-sectional view of the structure of FIG. 4F in a perpendicular cross-section plane.

FIG. 5 is a cross-section view drawn along a plane (III-III', FIG. 2) parallel to the extension direction of gate 21, perpendicular to the cross-section axis of FIGS. 4A to 4F.

As illustrated in FIG. 5, gate 21 extends above active region 32 and bears on either side of active region 32 on insulation regions 34. Gate 21 is insulated from underlying channel 40 by an insulator 22. Channel 40 is separated from active region 32 by insulator 25.

As illustrated in FIGS. 4F and 5, channel 40 and insulator 25 exhibit according to the present invention constant thicknesses. The resulting transistor then no longer exhibits the malfunctions of known devices.

This is obtained due to the elimination, according to the present invention, of the forming of the peripheral facets conventionally obtained on growth of thin single-crystal layers such that SiGe layer 38 and Si layer 40 on single-crystal wafer 30.

The present invention enables obtaining one or several thin single-crystal semiconductor layers on a substrate with no facets. The absence of facets enables keeping, for the successive layers, a planar surface area equal to the initial surface area of the substrate. This enables decreasing the integration surface areas of the guards conventionally intended to compensate for the forming of facets. It is thus possible to increase the density of integrated devices such as CMOS-transistor-based memories.

Further, such a result is advantageously obtained according to the present invention without using the forming of additional masks. The etchings according to the present invention for lowering the surfaces of active region 32 (FIG. 4B) and of insulation areas 34 (FIG. 4E) are implemented in self-aligned fashion. This simplifies the method according to the present invention with respect to known methods and avoids the need to provide guard distances, necessary in the case of non self-aligned masks.

Of course, the present invention is likely to have various alterations, improvements, and modifications which will readily occur to those skilled in the art. In particular, only those steps necessary to the understanding of the present invention have been described. It will be within the abilities of those skilled in the art to complete the method with any steps necessary to the forming of the desired device. Thus, for a channel region such as layer 40, of a thickness lower than some twenty nanometers, preferably lower than some ten nanometers, for example, from 6 to 7 nm, it will be desired to have on either side of gate 21 source/drain regions exhibiting a greater thickness. Then, it will be within the abilities of those skilled in the art to implement an additional epitaxy to form raised source/drain regions on either side of insulated gate 21. Such an epitaxy may take place after forming of gate 21 described in relation with FIG. 4D and before the selective etching of insulation areas 34 described in relation with FIG. 4E.

Further, it will be within the abilities of those skilled in the art to bring any material and thickness modifications necessary in a given technological process. In particular those skilled in the art will adapt the material of spacer 23 of gate 21 so that it is not affected by the etching of insulation areas 34 described in relation with FIG. 4E.

Moreover, it has been disclosed (FIGS. 4B-C) that etching height h of region 32 is selected so that the upper surface of upper Si layer 40 reaches initial level 361 of region 32. According to a variation, not shown, the upper surface of Si layer 40 rises above initial level 361 of region 32. Those skilled in the art may adapt height h to the implementation of an additional drain/source epitaxy after forming of gate 21 so that the upper surface of the drain/source reaches or exceeds initial level 361.

Further, the process described in relation with FIGS. 4A to 4F is an example only of embodiment of the present invention. A variation of the initial steps is illustrated in FIGS. 6A and 6B.

Figure 6A:
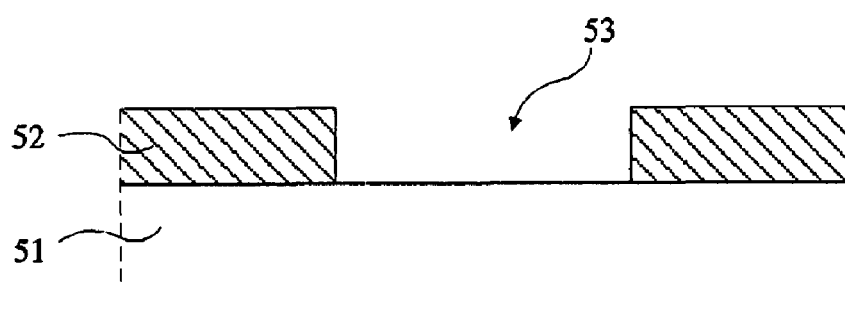
FIGS. 6A and 6B show a variation of preliminary steps of implementation of a method according to the present invention.

As illustrated in FIG. 6A, instead of starting from an active region delimited by trenches filled with an insulator, it is started from a silicon layer or substrate 51 on which an insulating layer (or a stacking of layers) 52 is deposited. An opening 53 defining an active region in silicon 51 is formed in layer 52.

Figure 6B:
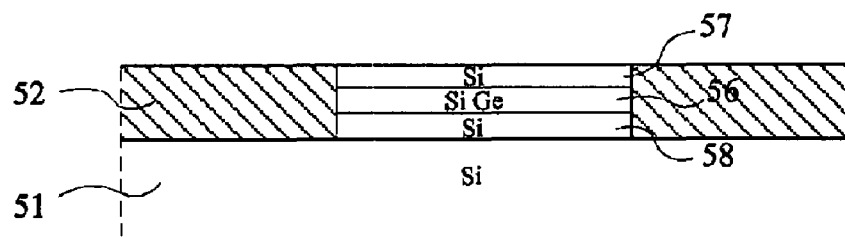

As illustrated in FIG. 6B, single-crystal silicon-germanium and silicon layers 56 and 57 are grown in opening 53, possibly on a base silicon layer 58. Insulating layer 52 may then, similarly to what has been described hereabove, be partially or totally etched to have access the periphery of silicon-germanium layer 56 and be removed by selective etch.

Moreover, it should be understood by those skilled in the art that, although the present invention has only been described in the context of the forming of a MOS transistor having a thin channel region on an insulator, this is an example of application only.

The present invention may be used in any type of device using sacrificial semiconductor layers intended to be removed. For example, the present invention may be used to form MOS transistors of all-around type, dual-gate or multiple-gate MOS transistors.

Generally, although the present invention has been described in the context of a silicon process, it applies to any integrated circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a single-crystal semiconductor layer portion above a hollowed area, comprising:
   providing an insulating border on an active single-crystal semiconductor region;
   lowering an upper surface of the active region to a height lower than a height of said insulating border;
   thereafter growing by selective epitaxy, on top of the active single-crystal semiconductor region, a sacrificial single-crystal semiconductor layer;
   growing by selective epitaxy, on top of the sacrificial single-crystal semiconductor layer, a single-crystal semiconductor layer;

removing the sacrificial single-crystal semiconductor layer;

wherein the epitaxial growth is performed while the active region is surrounded with the raised insulating border and the removal of the sacrificial single-crystal semiconductor layer is performed through an access resulting from an at least partial removal of the raised insulating border.

2. The method of claim 1, wherein the active single-crystal semiconductor region and the single-crystal semiconductor layer are made of silicon, and the sacrificial layer is made of silicon-germanium.

3. The method of claim 1, wherein the lowering height of the upper surface of the active region is substantially equal to the sum of the thicknesses of the epitaxial layers.

4. The method of claim 1, wherein the empty interval left byte removal of the sacrificial layer is filled with an insulator.

5. The method of claim 1, wherein the empty interval left by the removal of the sacrificial layer is filled with an electrically or thermally conductive material such as a metal.

6. A method for forming a MOS transistor, comprising forming a transistor channel by forming a single-crystal semiconductor layer portion above a hollowed area, comprising:

providing an insulating border on an active single-crystal semiconductor region;

lowering an upper surface of the active region to a height lower than a height of said insulating border;

thereafter growing by selective epitaxy, on top of the active single-crystal semiconductor region, a sacrificial single-crystal semiconductor layer;

growing by selective epitaxy, on top of the sacrificial single-crystal semiconductor layer, a single-crystal semiconductor layer;

removing the sacrificial single-crystal semiconductor layer;

wherein the epitaxial growth is performed while the active region is surrounded with the raised insulating border and the removal of the sacrificial single-crystal semiconductor layer is performed through an access resulting from an at least partial removal of the raised insulating border.

7. The method of claim 6, wherein removal of the sacrificial layer is performed after forming of an insulated gate on said single-crystal semiconductor layer.

8. The method of claim 6, wherein the forming of a gate is followed by a step of epitaxial growth of a single-crystal semiconductor material of same nature as that of the channel to form raised source/drain areas.

9. A method for forming a MOS transistor with several gates, comprising a method for forming the insulated single-crystal semiconductor layer of claim 1.

10. The method of claim 6, comprising forming a MOS transistor with several gates.

11. The method of claim 1, wherein growing the single-crystal semiconductor layer comprises growing the single-crystal semiconductor layer to have a substantially uniform thickness.

12. An MOS transistor formed by a method comprising: providing an insulating border on an active single-crystal semiconductor region; lowering an upper surface of the active region to a height lower than a height of said insulating border;

thereafter growing by selective epitaxy, on top of the active single-crystal semiconductor region, a sacrificial single-crystal semiconductor layer;

growing by selective epitaxy, on top of the sacrificial single-crystal semiconductor layer, a single-crystal semiconductor layer;

removing the sacrificial single-crystal semiconductor layer;

wherein the epitaxial growth is performed while the active region is surrounded with the raised insulating border and the removal of the sacrificial single-crystal semiconductor layer is performed through an access resulting from an at least partial removal of the raised insulating border.

13. The method of claim 1, wherein the at least partial removal of the raised insulating region is performed without masking.

14. The method of claim 6, wherein the at least partial removal of the raised insulating region is performed without masking.

* * * * *

UNITED STATES PATENT AND TRADEMARK OFFICE
CERTIFICATE OF CORRECTION

PATENT NO. : 7,622,368 B2
APPLICATION NO. : 11/704638
DATED : November 24, 2009
INVENTOR(S) : Didier Dutartre et al.

It is certified that error appears in the above-identified patent and that said Letters Patent is hereby corrected as shown below:

Col. 7, line 17 should read:
by the removal of the sacrificial layer is filled with an insulator.

Signed and Sealed this

Fifth Day of January, 2010

David J. Kappos
*Director of the United States Patent and Trademark Office*